United States Patent [19]

Hazuki et al.

[11] Patent Number: 4,582,563
[45] Date of Patent: Apr. 15, 1986

[54] PROCESS FOR FORMING MULTI-LAYER INTERCONNECTIONS

[75] Inventors: Yoshikazu Hazuki, Tokyo; Takahiko Moriya, Yokosuka, both of Japan

[73] Assignee: Kabushiki Kaisha Toshiba, Kawasaki, Japan

[21] Appl. No.: 675,859

[22] Filed: Nov. 28, 1984

[30] Foreign Application Priority Data

Nov. 28, 1983 [JP] Japan ................. 58-223569

[51] Int. Cl.$^4$ .............. B44C 1/22; C23F 1/02; H01L 23/48; H01L 29/46
[52] U.S. Cl. .................. 156/643; 29/591; 156/644; 156/646; 156/657; 156/659.1; 204/192 EC; 204/192 E; 357/71; 427/90; 427/91; 427/93
[58] Field of Search ............ 427/90, 91, 93; 357/71; 204/192 EC, 192 E; 29/580, 591; 252/79.1; 430/313, 317, 318; 156/643, 644, 646, 653, 656, 657, 659.1, 661.1

[56] References Cited

U.S. PATENT DOCUMENTS

| | | | |
|---|---|---|---|
| 4,307,179 | 12/1981 | Chang et al. | 156/656 X |
| 4,330,931 | 5/1982 | Liu | 29/571 |
| 4,367,119 | 1/1983 | Logan et al. | 156/644 X |
| 4,520,041 | 5/1985 | Aoyama et al. | 427/88 |

FOREIGN PATENT DOCUMENTS 57-76833  5/1982  Japan .

Primary Examiner—William A. Powell
Attorney, Agent, or Firm—Oblon, Fisher, Spivak, McClelland & Maier

[57] ABSTRACT

First conductive members are buried in first holes formed in a first insulating film to connect the second interconnection layers, formed through first and second insulating films, to a semiconductor substrate. Second conductive members are buried in second holes formed to be positioned on the first holes of the second insulating film. Thus, the reliability of a semiconductor device of a multi-layer interconnection structure is improved, and the integration thereof is improved.

5 Claims, 7 Drawing Figures

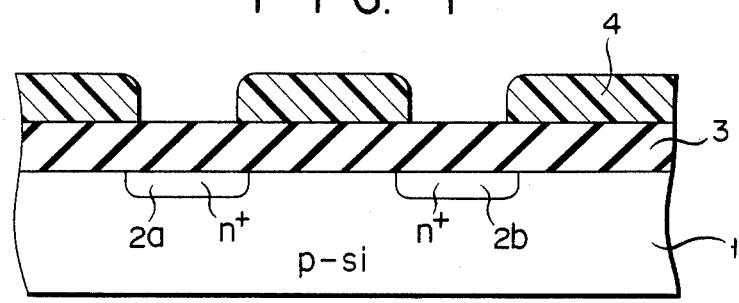
F I G. 1
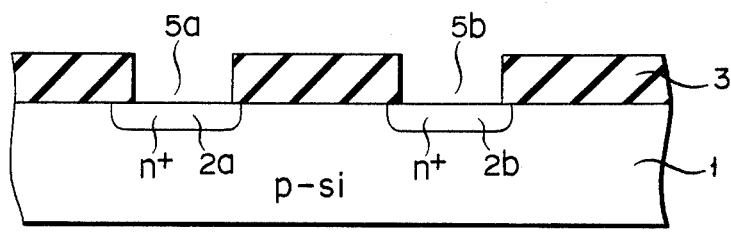
F I G. 2
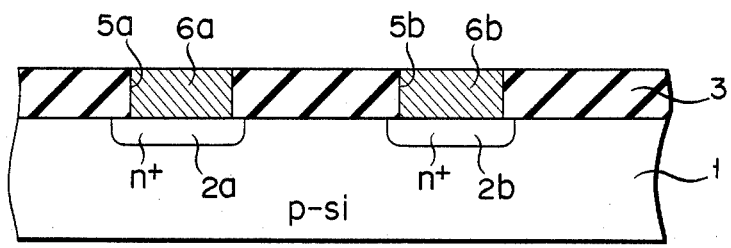
F I G. 3
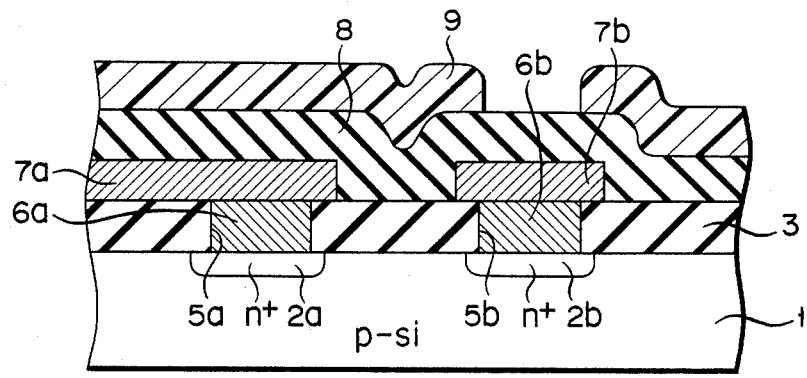
F I G. 4

PROCESS FOR FORMING MULTI-LAYER INTERCONNECTIONS

BACKGROUND OF THE INVENTION

The present invention relates to a process for forming a semiconductor device and, more particularly, to a process for forming multi-layer interconnections.

Multi-layer interconnections have become indispensable as the large scale integration of semiconductor integrated circuits advance. To contact the upper interconnection layers with a substrate when the interconnection layers are ordinarily formed in a multi-layer configuration, it is necessary to form via holes in a thick insulating film laminated with a plurality of layers. This causes the disconnection of the upper interconnection layers at the stepwise difference of the via hole. The disconnection of the interconnections tends to occur particularly when a directional dry etching process such as reactive ion etching (RIE) is used for microminiaturization. This is because the via hole formed by the RIE process has an abrupt step at the side wall.

As a process for preventing the disconnection of such multi-layer interconnections the following process is employed. A first interconnection layers is formed through a first insulating film on a semiconductor substrate formed with a circuit element such as a doped layer. The first interconnection layers is contacted with the substrate through the via holes formed at the first insulating film. At this time, via holes for connecting second interconnection layers formed layer is simultaneously formed in addition to the via holes for contacting the first interconnection layers with the substrate in the first insulating film. An auxiliary interconnection layer contacting the substrate through the via holes is formed on the first insulating layer simultaneously with the first interconnection layers. Subsequently, second interconnection layers are formed through the second insulating film on the substrate formed with the first interconnection layers. The second interconnection layers are contacted with the auxiliary interconnection layers through the via holes formed at the second insulating film. It is necessary to displace a certain degree of distance from the via hole positions for contacting the second interconnection layers with the auxiliary interconnection layers to the via hole positions for contacting the auxiliary interconnection layers with the substrate. This is because an irregular surface increases when the via hole positions are superposed.

According to this process, it is not necessary to engrave deep via holes passing through the first and second insulating film. As a result, it can prevent to a certain degree the disconnection of the second interconnection layer.

However, according to this process, two via holes are necessary at the displaced position for connecting the second interconnection layer with the substrate, and the integration of the integrated circuit decreases.

SUMMARY OF THE INVENTION

An object of the present invention is to provide a process for forming multi-layer interconnections of a semiconductor device which prevents a disconnection of the interconnection layer at a via hole position formed in an insulating film without decreasing the integration and, thus, also improves the reliability of the semiconductor device.

According to the present invention, a process is presented. The process comprises the steps of forming a first insulating film on a semiconductor substrate, the semiconductor substrate having circuit elements, forming first holes in the first insulating film, burying first conductive members in the first holes, forming first interconnection layers on the first insulating film, forming a second insulating film on the first insulating film, on which the first interconnection layers are formed, forming second holes in the second insulating film to be positioned at least in part over the first holes, burying second conductive members in the second holes, and forming the second interconnection layers contacting the second conductive members on the second insulating film to connect the second interconnection layers to ths substrate.

BRIEF DESCRIPTION OF THE DRAWINGS

FIGS. 1 through 7 are sectional views showing the interconnection forming steps of a semiconductor device according to one embodiment of the present invention.

DETAILED DESCRIPTION OF THE PREFERRED EMBODIMENTS

Figure 5:
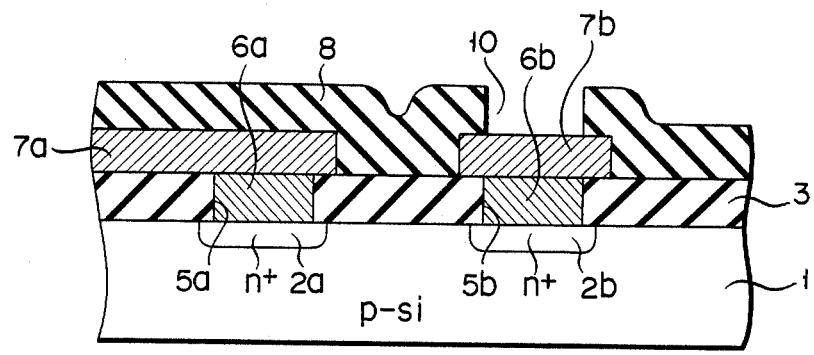

One embodiment of the present invention will now be described in detail with reference to FIGS. 1 through 7. In FIGS. 1 through 7, reference numeral 1 designates a p-type Si substrate formed with circuit elements which include n+ doped regions 2a, 2b. These figures illustrates how to form first interconnection layers 7a which are connected to the n+ regions 2a, and how to form second interconnection layers 12 which are connected to the n+ doped regions 2b. In these figures, only one of the regions 2a, only one of the regions 2b, only one of the layers 7a and only one of the layers 12 are shown.

As shown in FIG. 1, a first silicon dioxide ($SiO_2$) film is formed by a CVD as a first insulating film 3 on this Si substrate 1. The thickness of the first insulating film 3 is, for example, 1 $\mu$m. A photoresist mask 4 is formed by a known photoengraving process (PEP) on the first insulating film 3. The thickness of the photoresist mask 5 is approx. 1 $\mu$m, and windows are formed on the regions 2a, 2b.

Subsequently, as shown in FIG. 2, the first insulating film 3 is selectively etched, thereby forming a first hole 5b and a third hole 5a on the doped regions 2b, 2a. This etching step is carried out by the RIE using a mixture gas of $CF_4$ and $H_2$. The third hole 5a is for a first interconnection layer, and the first hole 5b is for a second interconnection layer. After these holes 5a, 5b are formed, the photoresist mask 4 is removed.

Then, as shown in FIG. 3, a first conductive member 6b and a third conductive member 6a are buried respectively in the holes 5b, 5a. These conductive members 6a, 6b are buried in this embodiment by a selective CVD process using $WF_6$ and $H_2$ gas. Preferable conditions of this CVD process are 250° C.-500° C. of the substrate temperature, $1 \times 10^{-3} - 760$ Torr of the pressure in a reactive tube, and $1 \times 10^{-4} - 5 \times 10^{-2}$ Torr of the partial pressure of the $WF_6$. Approx. 1 $\mu$m of thickness of a tungsten (W) layer is buried in the holes 5a, 5b as the conductive members 6a, 6b by performing a CVD for a predetermined period of time under these conditions. The W layer is selectively deposited only on the substrate 1 exposed with the holes 5a, 5b, but is not deposited on the insulating film 3.

Subsequently, as shown in FIG. 4, a first interconnection layer 7a and an auxiliary conductive layer 7b made of aluminum (Al) respectively contacting with the conductive members 6a, 6b are formed on the first insulating film 3. These layers 7a, 7b are formed of an Al layer deposited to a thickness of approx. 0.8 μm by sputtering. This patterning step is carried out by the RIE using $CCl_4$ gas and $Cl_2$ gas. The auxiliary conductive layer 7b is used only for mediating to connect the second interconnection layer to be formed later to the first conductive member 6b. An $SiO_2$ film is thus formed by a CVD as a second insulating film 8 to a thickness of approx. 1 μm on the substrate formed with the layers 7a, 7b. A photoresist mask 9 is formed by a PEP process on the second insulating film 8.

A second hole 10 to be positioned at least in part over the first hole 5b for connecting a second interconnection layer, to be formed later, to the n+ doped region 2b is formed, as shown in FIG. 5, by selectively etching the second insulating film 8. In this etching step, the RIE using $CF_4$ gas and $H_2$ gas is used similarly to the case of etching the first insulating film 3.

Figure 6:
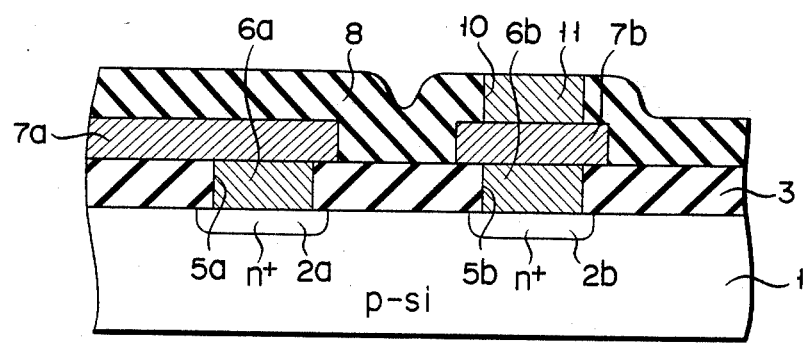

Subsequently, as shown in FIG. 6, a W layer of approx. 1 μm is buried in the second hole 10 as a second conductive member 11 in a similar step as that in FIG. 3.

Figure 7:
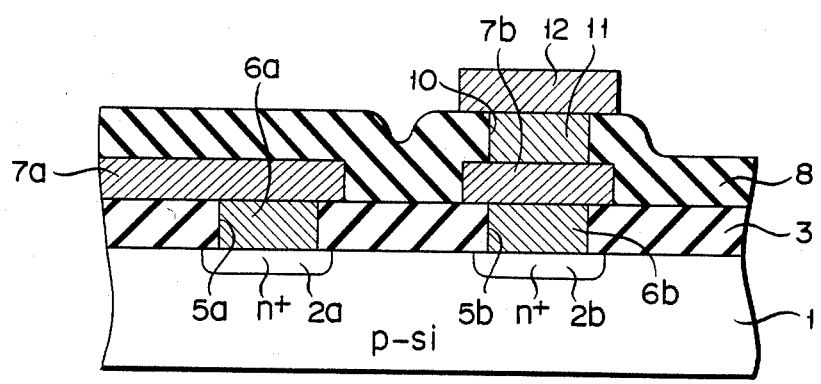

As shown in FIG. 7, an Al layer condacting the second conductive member 11 is formed as a second interconnection layer 12 on the second insulating film 8. This second interconnection layer 12 is patterned by the RIE process as the Al layer of approx. 0.8 μm by sputtering, similar to the previous layers 7a, 7b.

Though omitted in FIG. 7, another second interconnection layer is connected at a predetermined position to the first interconnection layer 7a as required. This step may be the same as the step of forming the second hole 10 shown in FIGS. 4 through 7, the step of burying the second conductive member 11 and the subsequent step of forming the second interconnection layer 12.

According to the embodiment described above, the stepwise differences of the respective holes are eliminated. Therefore, not only the first interconnection layers but also the second interconnection layers can be effectively prevented from being disconnected. Further, since the second interconnection layer is connected to the substrate, these spaces may be small, thereby improving the integration of the integrated circuit. Consequently, according to the embodiment described above, a high density integrated circuit having high reliability can be obtained.

The present invention is not limited to the particular embodiments described above. Various other changes and modifications may be made within the spirit and scope of the present invention as listed below.

(a) In the embodiment described above, the conductive members 6a, 6b and 11 are respectively buried to the same thickness as the depth in the holes 5a, 5b and 10. It is sufficiently advantageous even if these conductive members are buried in approximately half the depth of the holes.

(b) The burying process of the conductive members may be achieved by a selective CVD using another refractory metal halide in addition to the selective CVD using the $WF_6$. For example, tungsten chloride ($WCl_6$) gas may be used. Further, fluoride or chloride of molybdenum (Mo), niobium (Nb), tantalum (Ta), titanium (Ti), etc., may be used in addition to the W.

(c) Refractory metal silicide may be used as conductive members buried in the hole. To this end, a mixture gas of refractory metal halide gas and gas including Si (e.g., $SiH_4$, $SiH_2Cl_2$, etc.) may be used in the selective CVD.

(d) As the first and second insulating films, silicate glass doped with impurities (P, As, B, etc.), silicon nitride ($Si_3N_4$) or these laminated films may be used.

(e) As the first and second interconnection layers, metal such as Mo, W, Pt, Au, etc. or silicide thereof, or polycrystalline Si may be used in addition to Al.

(f) The auxiliary conductive layer 7b is provided only for mediating and may be omitted.

(g) In the embodiment described above, the 2-layer interconnections have been described. However, the present invention may be effective when forming 3-layer interconnections or more.

(h) The present invention may be effective when the first interconnection layer 7a is, for example, a gate electrode of a MOS device, and the first interconnection layer 7a is not connected to the substrate In this case, the third hole 5a and the third conductive member 6a are not formed.

What is claimed is:

1. A process for forming multi-layer interconnections including at least first and second interconnection layers in a semiconductor device comprising the steps of:

forming a first insulating film on a semiconductor substrate, the semiconductor substrate having circuit elements;

forming first holes in the first insulating film;

burying first conductive members in the first holes;

forming first interconnection layers on the first insulating film;

forming a second insulating film on the first insulating film, on which the first interconnection layers are formed;

forming second holes in the second insulating film to be positioned at least in part over the first holes;

burying second conductive members in the second holes; and forming the second interconnection layers contacting the second conductive members on the second insulating film to connect the second interconnection layers to the substrate.

2. The process according to claim 1, wherein said first and second conductive members are refractory metals deposited by a selective chemical vapor deposition using a refractory metal halide gas and a hydrogen gas.

3. The process according to claim 1, wherein said first and second conductive members are refractory metal silicides deposited by a selective chemical vapor deposition using a refractory metal halide gas; a gas including silicon and a hydrogen gas.

4. The process according to claim 1, wherein auxiliary conductive layers are formed on the first conductive members to be positioned beneath the second conductive members at the steps of forming the first interconnection layers.

5. The process according to claim 1, wherein third holes are formed in the first insulating film at the step of forming the first holes, and third conductive members are buried in the third holes to connect the first interconnection layers to the substrate at the step of burying the first conductive members.

* * * * *